(12) United States Patent
Ker et al.

(10) Patent No.: US 7,170,726 B2
(45) Date of Patent: Jan. 30, 2007

(54) UNIFORM TURN-ON DESIGN ON MULTIPLE-FINGER MOSFET FOR ESD PROTECTION APPLICATION

(75) Inventors: Ming-Dou Ker, Hsinchu (TW); Che-Hao Chuang, Hsinchu (TW); Wen-Yu Lo, Taichung (TW)

(73) Assignee: Silicon Integrated Systems Corp., Hsin chu (TW)

( * ) Notice: Subject to any disclaimer, the term of this patent is extended or adjusted under 35 U.S.C. 154(b) by 355 days.

(21) Appl. No.: 10/345,325

(22) Filed: Jan. 16, 2003

(65) Prior Publication Data

US 2004/0141266 A1 Jul. 22, 2004

(51) Int. Cl.
*H02H 3/22* (2006.01)
(52) U.S. Cl. ......................... 361/56; 361/111
(58) Field of Classification Search ............... 361/56, 361/57, 58, 91.1, 111; 257/355, 356, 357, 257/358, 359, 360
See application file for complete search history.

(56) References Cited

U.S. PATENT DOCUMENTS

| | | | | |
|---|---|---|---|---|
| 5,134,321 A | * | 7/1992 | Mehta | 327/404 |
| 5,670,803 A | * | 9/1997 | Beilstein et al. | 257/278 |
| 5,959,488 A | * | 9/1999 | Lin et al. | 327/313 |
| 6,445,068 B1 | * | 9/2002 | Sofue et al. | 257/723 |
| 6,462,601 B1 | * | 10/2002 | Chang et al. | 327/313 |
| 6,583,972 B2 | * | 6/2003 | Verhaege et al. | 361/56 |

* cited by examiner

*Primary Examiner*—Stephen W. Jackson
*Assistant Examiner*—Danny Nguyen
(74) *Attorney, Agent, or Firm*—Birch, Stewart, Kolasch & Birch, LLP (57) ABSTRACT

An electrostatic discharge protection circuit. The electrostatic discharge (ESD) circuit utilizes inductors and resistors added to sources of multiple fingers of the NMOS transistor, which is triggered by some feedback circuit uniformly. When under an ESD zapping, a finger MOS transistor is trigger initially to snapback region owing to its layout or other causes, a voltage drop across the inductor or the resistor connected to the source of the finger MOS transistor is occurred and presented to gates of the other finger MOS transistors by the feedback circuit. Thus, the other finger MOS transistors are turned on.

24 Claims, 12 Drawing Sheets

UNIFORM TURN-ON DESIGN ON MULTIPLE-FINGER MOSFET FOR ESD PROTECTION APPLICATION

BACKGROUND OF THE INVENTION

1. Field of the Invention

The present invention relates to ESD protection circuits, and particularly to ESD protection circuits with uniform turn-on design on multiple-finger MOSFET for ESD protection.

2. Description of the Related Art

A NMOS is an effective ESD protection device, which is based on snapback mechanism. Snapback mechanism enables the NMOS to conduct a high level of ESD current between its drain and source while an ESD zapping occurs. But, there is a weakness of the NMOS for ESD protection caused by the low snapback voltage of the parasitic NPN of the NMOS, which leads to second breakdown, which in turn leads to filamentation and subsequently to permanent damage to transistor. During snapback, the current is conducted uniformly by all the fingers of the NMOS and the snapback device current scales linearly with the device width. This scaling is possible because during snapback the resistance has a positive temperature coefficient of resistance. Thus, if the current in any region increases, that region gets hot, thereby increasing the resistance, which promote the current to flow elsewhere. However, with the onset of second breakdown, the resistance of the current path has a negative temperature coefficient dependence, encouraging current hogging and filament formation. This non-uniformity in current distribution essentially concentrates the current in certain localized regions of the NMOS. Thus, the discharge potential of the current cannot be fully developed.

Figure 1:
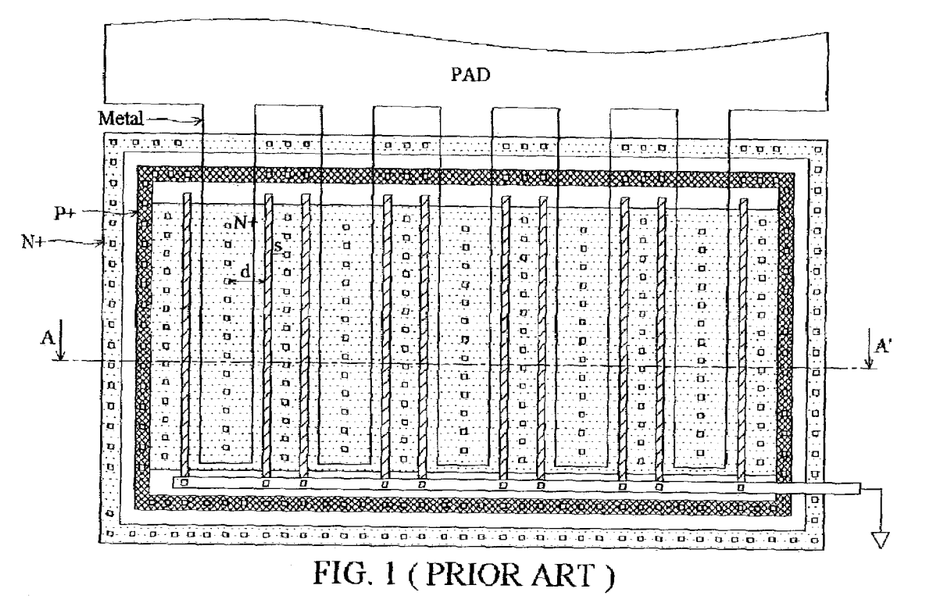
FIG. 1 is a diagram showing an layout top-view of traditional multi-finger gate-grounded NMOS or gate-VDD PMOS for ESD protection design.
Figure 2:
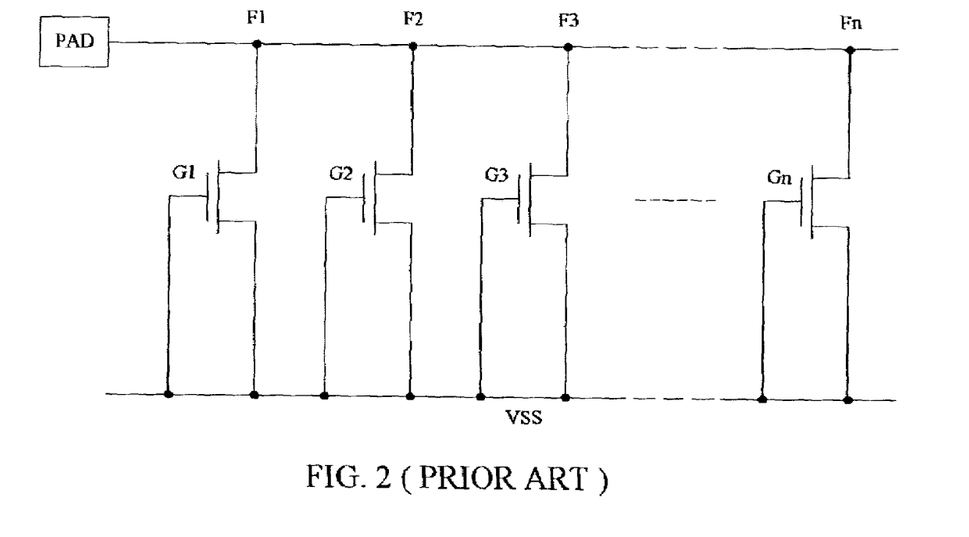
FIG. 2 is a schematic diagram showing the multi-finger GGNMOS.
Figure 3A:
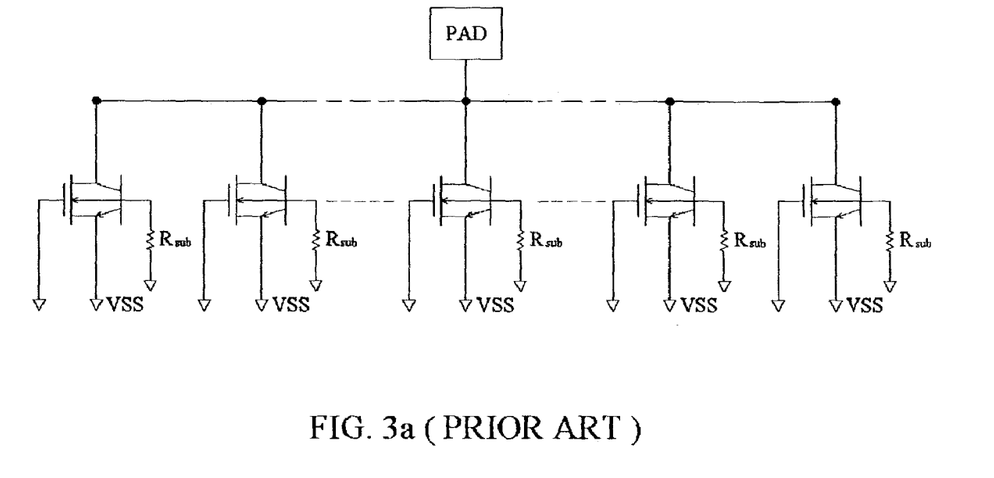
FIGS. 3a and 3b are a schematic diagram showing an equivalent circuit of the multi-finger GGMOS.
Figure 3B:
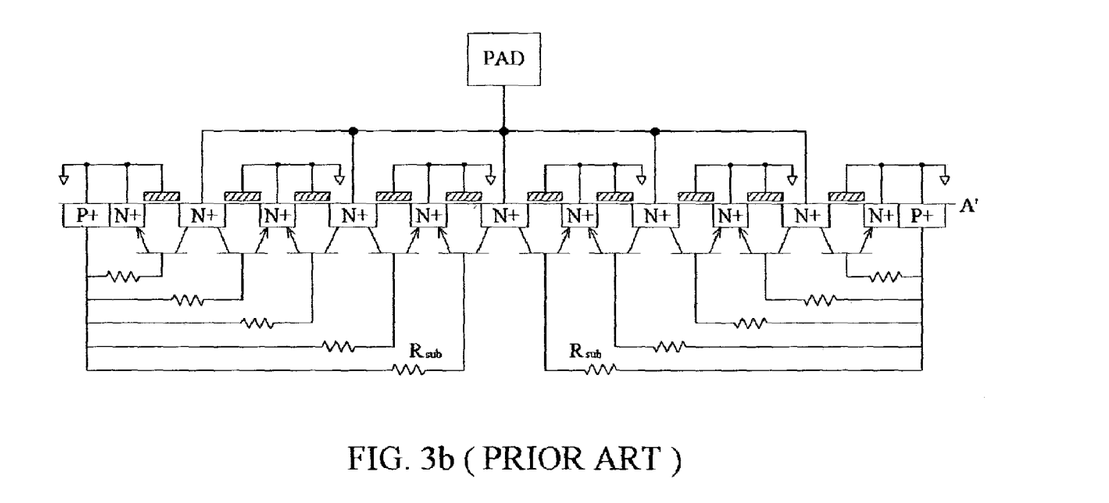

FIG. 1 shows the layout top-view of traditional multi-finger gate-grounded NMOS (GGNMOS) or gate-VDD PMOS for ESD protection design. FIG. 2 shows the schematic of the multi-finger GGNMOS. The drains of the MOSFETs are connected to the pad. The sources and gates of the MOSFET are connected to the ground (VSS). All of the MOSFETs are in parallel. FIG. 3(a) shows the equivalent circuit of the multi-finger GGNMOS, and the cross-sectional view is shown in FIG. 3(b). Because of the center finger has the farthest spacing to the guard ring, then the equivalent substrate resistance Rsub is the largest. The substrate resistance Rsub of every finger is different. This often causes the non-uniform turn-on issue on the multiple-finger NMOS device in the ESD protection circuit.

Figure 4A:
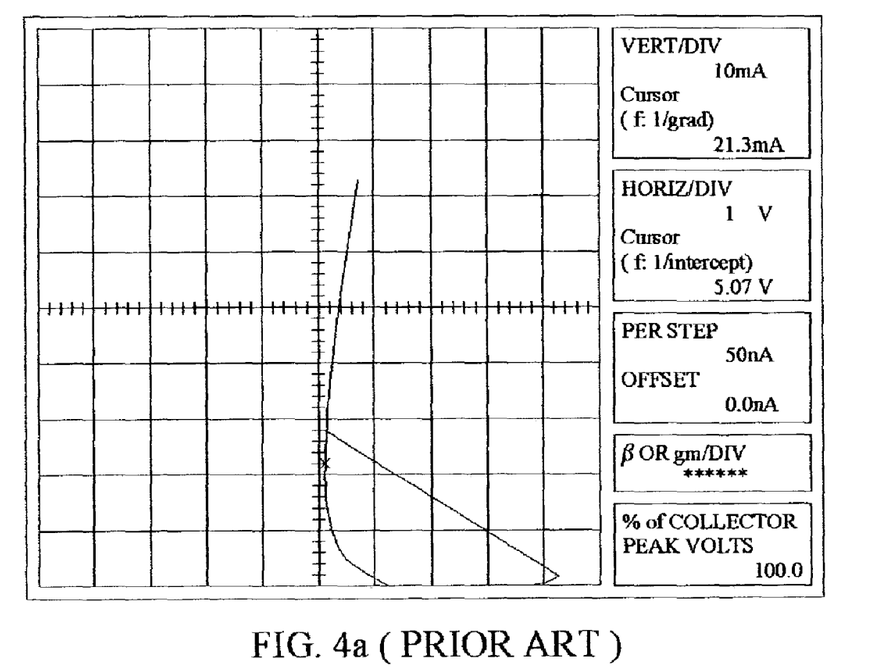
FIG. 4a is a dc I-V curve diagram of the GGNMOS.
Figure 4B:
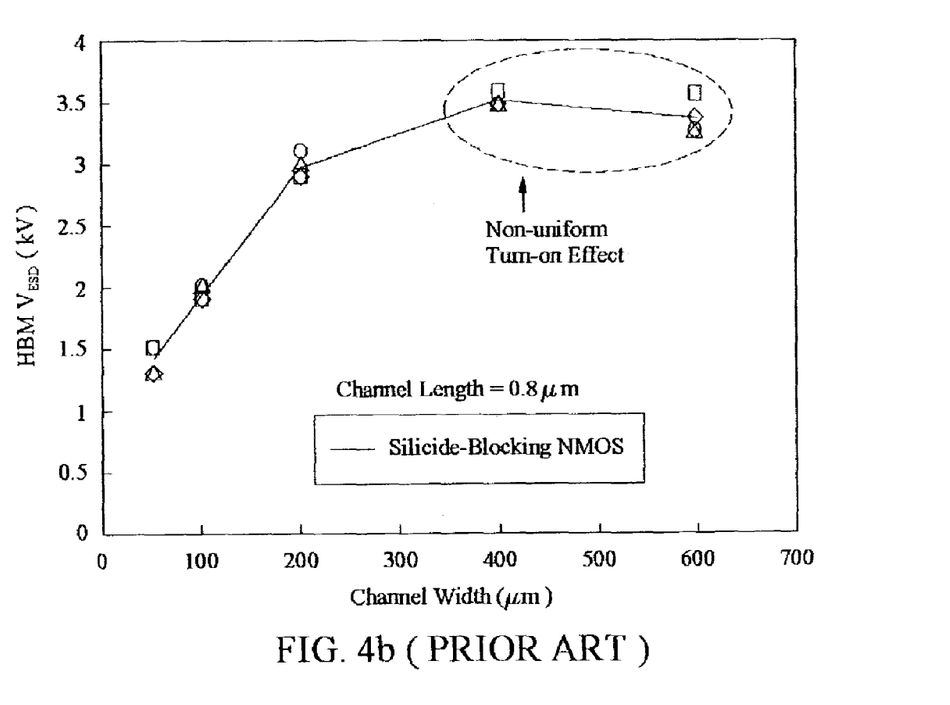
FIG. 4b illustrates the dependence on the width of the ESD protection circuit and the susceptibility.

FIG. 4(a) shows the snapback I-V curve of the GGNMOS. When the parasitic lateral bipolar is turned on under the ESD event, the snapback phenomenon is happened. If one of the multiple fingers is turned on first, then the operating voltage is pulled down to the holding voltage and the other fingers will not be turned on. Therefore, the ESD level will not increase as the finger number increased. This is the non-uniform turn-on effect shown in FIG. 4(b). The ESD level can not be continually increased when the device width is increased.

Figure 5:
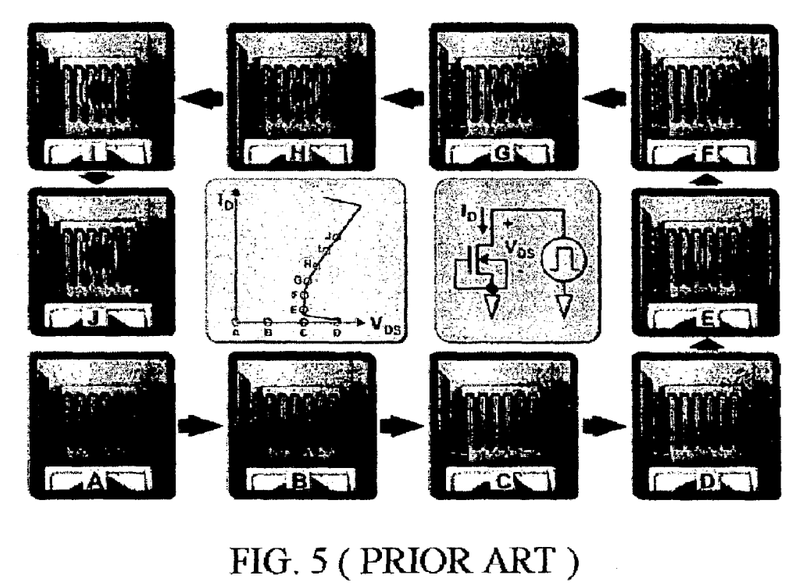
FIG. 5 illustrates the turn-on behavior of the multi-finger GGNMOS.

FIG. 5 shows the turn-on behavior of the multi-finger GGNMOS under ESD stress. At point A, there is no ESD pulse and the GGNMOS is kept off under normal condition. At point B-point D, when the ESD pulse is increased, the GGNMOS is still kept off because of the gates are connected to the ground without channel induced. At point E-point F, when the ESD pulse is increased, the breakdown at the drain side is occurred and the parasitic lateral BJT at center is triggered on and the snapback effect is occurred. Therefore, the other fingers will not be turned on and the ESD current will flow through the turned-on fingers to the ground. This is the so called non-uniform turn-on phenomenon of the multi-finger MOSFETs. At point G-point J, when the ESD pulse is more increased, the fingers closed to the center are fully turned on, but the fingers far away the center are still kept off. With only few fingers turned on during ESD zapping, the NMOS will have a low ESD robustness even if the NMOS is drawn with larger device dimension.

Figure 6:
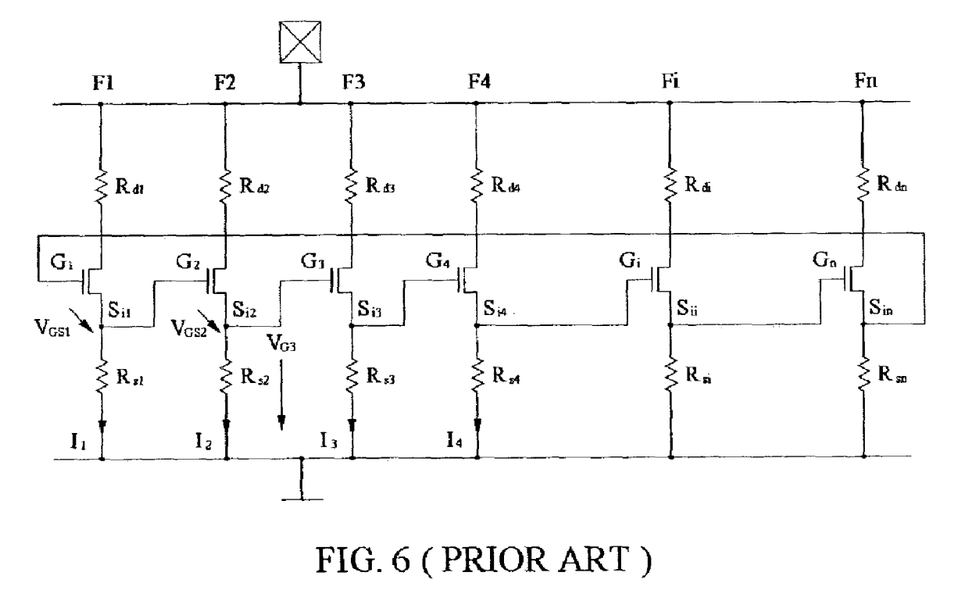
FIG. 6 is a schematic diagram showing the conventional multi-finger GGNMOS with turn-on design.

In order to solve the non-uniform turn-on issue, the drain and source resistance (Rd and Rs) are used in FIG. 6. For example, when finger F2 is triggered, a potential Vsi2 is built. The potential is presented to the gate of the finger F3. As long as no current flows through F3, Vsi3 will be zero, and thus a bias Vgs3 will exist. When Vgs3 exceeds the threshold voltage of the NMOS, finger F3 will be fully turned on. The same mechanism will create a "domino effect" that will turn on all fingers one after the other.

The ESD protection circuits mentioned above usually does not turn on uniformly. There is a need for an ESD protection circuit with the property of turning on uniformly. Assuring that at least a finger is turn on initially, the other fingers are definitely triggered turning on by it. Thus, ESD susceptibility of integrated circuits is improved.

SUMMARY OF THE INVENTION

It is therefore an object of the present invention to provide an ESD protection circuit with the capability of uniform turning on.

To achieve the above objects, the present invention disclosed an electrostatic discharge (ESD) circuit with uniform turn-on design on multiple fingers to be capable of conducting a large current while an ESD zapping occurs. Therefore, susceptibility of the I/O circuit to which the ESD circuit is attached is improved. The finger MOS transistors of the ESD circuit in the present invention are added with inductors or resistors to sources, and implemented with some feedback circuit to trigger the finger MOS transistors uniformly. When under an ESD zapping, a finger MOS transistor is trigger initially to snapback region owing to its layout or other causes, a voltage drop across the inductor or the resistor connected to the source of the finger MOS transistor is occurred and presented to gates of the other finger MOS transistors by the feedback circuit to promote the other finger MOS transistors turn on. Thus, at least a finger is turn on initially, the other fingers are definitely triggered turning on by it. Non-uniform turn-on issue is addressed by the present invention. All the fingers are uniformly turned on to improve susceptibility of integrated circuits.

The present invention provides an electrostatic discharge protection circuit for an integrated circuit having an input/output pad including a first type MOS transistor having plural finger device cascaded wherein each finger device has a source coupled to a gate of the next finger device and coupled to a first potential through an inductor and a drain coupled to the input/output pad, a last finger has a source coupled to a gate of a first finger device.

The present invention provides an electrostatic discharge protection circuit for an integrated circuit having an input/output pad including a first type MOS transistor having plural finger device wherein some of the plural fingers have drains coupled to the input pad, sources coupled to a first potential through plural loads, gates shorted together and plural diodes coupled between the gates and the sources of the plural finger devices and having anodes coupled to the sources of the plural finger devices and cathodes coupled to the gates of the plural finger devices.

BRIEF DESCRIPTION OF THE DRAWINGS

The aforementioned objects, features and advantages of this invention will become apparent by referring to the following detailed description of the preferred embodiment with reference to the accompanying drawings, wherein.

DETAILED DESCRIPTION OF THE INVENTION

The present invention disclosed an electrostatic discharge (ESD) circuit with uniform turn-on design on multiple fingers to be capable of conducting a large current while an ESD zapping occurs. New trigger mechanisms in the finger MOS transistors of the ESD circuit in the present invention are initiated by inductors or resistors to sources, and thanks to some feedback circuit to trigger the finger MOS transistors uniformly. A finger MOS transistor is triggered initially by an ESD zapping to snapback region owing to its layout or other causes. A voltage drop across the inductor or the resistor connected to the source of the finger MOS transistor is occurred and presented to gates of the other finger MOS transistors by the feedback circuit to promote the other finger MOS transistors turn on. Thus, at least a finger is turn on initially, the other fingers are definitely triggered on by it. Non-uniform turn-on issue is addressed by the present invention. All the fingers are uniformly turned on to improve susceptibility of integrated circuits.

The First Embodiment

Figure 7:
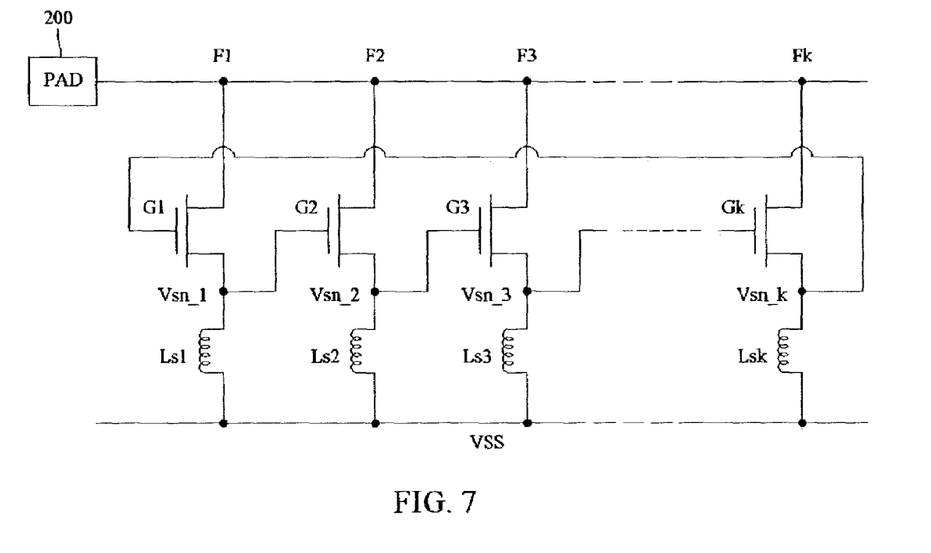
FIG. 7 is a schematic diagram showing an uniform turn-on design on multi-finger NMOS for input pad with source inductors.

FIG. 7 shows an electrostatic discharge protection circuit with the uniform turn-on design on multi-finger NMOS for input pad with sources inductors. The electrostatic discharge protection circuit for an integrated circuit having an input pad includes a NMOS transistor having finger devices F1–Fk cascaded. The finger device Fi, 1<i<k, has a source coupled to a gate of the next finger device Fi+1 and coupled to a potential VSS through an inductor Lsi and a drain coupled to the input pad 200. The last finger device Fk has a source coupled to a gate of a first finger device F1.

Under DC operating condition, the inductors Ls1–Lsk have zero impedance. Then, the gates G1–Gk and sources of the finger devices F1–Fk are shorted to the potential VSS. The drains of the finger devices F1–Fk are coupled to the pad. Therefore, the NMOS transistor is kept off under DC operating condition. When under the PS-mode (positive-to-$V_{SS}$) ESD stress condition, for example, the potential Vsn_2 triggered by the finger F2 is built. The potential Vsn_2 is presented to the gate G3 of the finger device F3. As long as no current flows through F3, the potential Vsn_3 will be zero, and thus a bias voltage Vgs3 will exist. When the bias voltage Vgs3 exceeds the threshold voltage of the finger device F3, the finger device F3 will be fully turn on. The same mechanism will create a "domino effect" that will turn on all finger devices one after the other. Because the impedances of all the inductors Ls1–Lsk under ESD zapping are very large, all the fingers devices of the NMOS will be turn on very fast.

Figure 8:
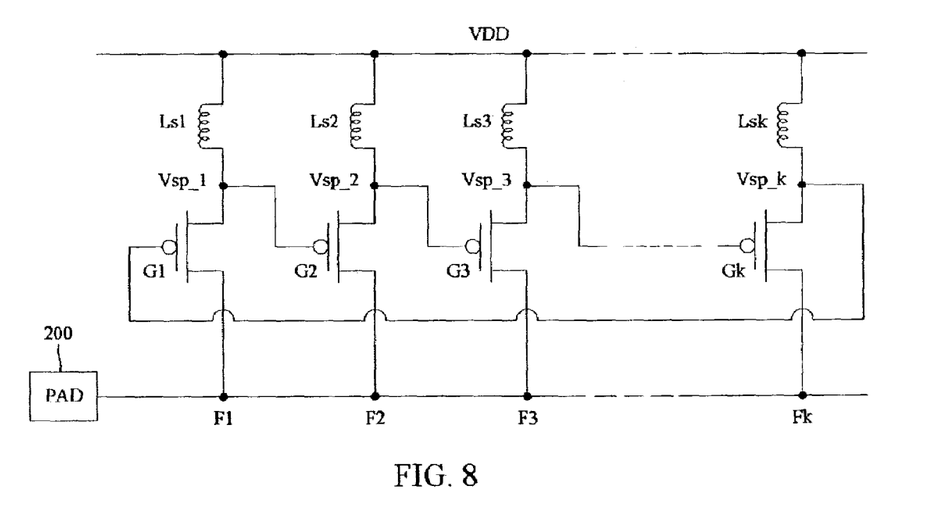
FIG. 8 is a schematic diagram showing an uniform turn-on design on multi-finger PMOS for input pad with source inductors.

FIG. 8 shows an electrostatic discharge protection circuit with the uniform turn-on design on multi-finger PMOS for input pad with sources inductors. The electrostatic discharge protection circuit for an integrated circuit having an input pad 200 includes a PMOS transistor having finger devices F1–Fk cascaded. The finger device Fi, 1<i<k, has a source coupled to a gate of the next finger device Fi+1 and coupled to a potential VSS through an inductor Lsi and a drain coupled to the input pad 200. The last finger device Fk has a source coupled to a gate G1 of a first finger device F1.

Under DC operating condition, the inductors Ls1–Lsk have zero impedance. Then, the gates G1–Gk and sources of the finger devices F1–Fk are shorted to the potential VSS. The drains of the finger devices F1–Fk are coupled to the pad. Therefore, the NMOS transistor is kept off under DC operating condition. When under the ND-mode (negative-to-$V_{DD}$) ESD stress condition, for example, the potential Vsp_2 triggered by the finger F2 is built. The potential Vsp_2 is presented to the gate G3 of the finger device F3. As long as no current flows through F3, the potential Vsp_3 will be zero, and thus a bias voltage Vgs3 will exist. When the bias voltage Vgs3 exceeds the threshold voltage of the finger device F3, the finger device F3 will be fully turn on. The same mechanism will create a "domino effect" that will turn on all finger devices one after the other. Because the impedances of all the inductors Ls1–Lsk under ESD zapping are very large, all the fingers devices of the NMOS will be turn on very fast.

Figure 9:
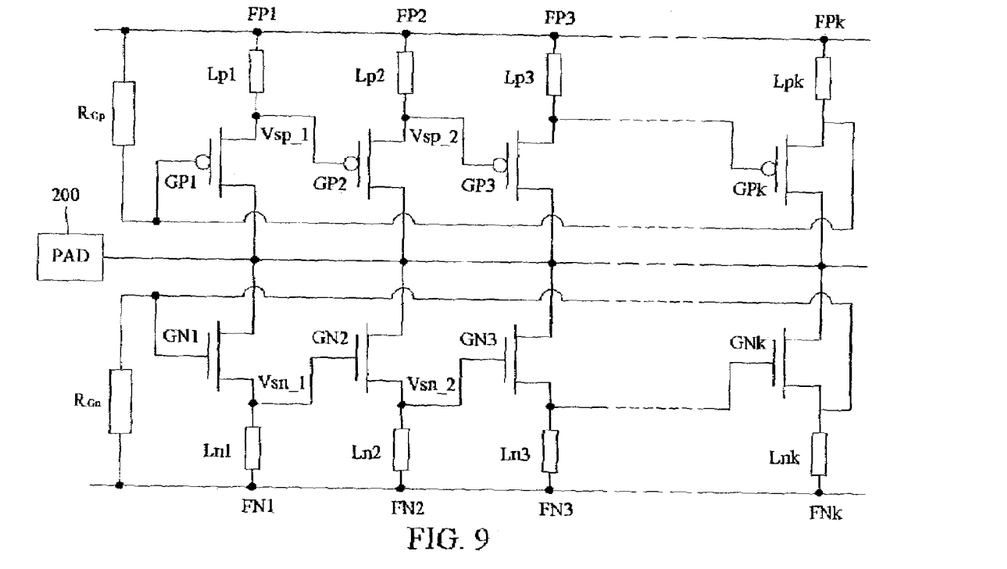
FIG. 9 is a schematic diagram showing an uniform turn-on design on multi-finger PMOS and NMOS for input pad with source inductors.

FIG. 9 shows an electrostatic discharge protection circuit with the uniform turn-on design on multi-finger NMOS and PMOS for input pad with sources inductors. The electrostatic discharge protection circuit for an integrated circuit having an input pad 200 includes a NMOS transistor having finger devices FN1–FNk cascaded and a PMOS transistor having finger devices FP1–FPk cascaded. The finger device FNi, 1<i<k, has a source coupled to a gate GNi+1 of the next finger device FNi+1 and coupled to a potential VSS through an inductor Lni and a drain coupled to the input pad 200. The last finger device FNk has a source coupled to a gate GN1 of a first finger device FN1. The finger device FPi, 1<i<k, has a source coupled to a gate GPi+1 of the next finger device FPi+1 and coupled to a potential VDD through an inductor Lpi and a drain coupled to the input pad 200. The last finger device FPk has a source coupled to a gate GP1 of a first finger device FP1.

When under the PS-mode ESD stress condition, for example, the potential Vsn_1 triggered by the finger FN1 is built. The potential Vsn_1 is presented to the gate GN2 of the finger device FN2. As long as no current flows through FN2, the potential Vsn_2 will be zero, and thus a bias voltage Vgs2 will exist. If the bias voltage Vgs2 exceeds the threshold voltage of the finger device FN3, the finger device FN3 will be fully turned on. The same mechanism will create a "domino effect" that will turn on all finger devices FN1–FNk one after the other. When under the ND-mode ESD stress condition, for example, the potential Vsp_1 triggered by the finger FP2 is built. The potential Vsp_1 is presented to the gate GP2 of the finger device FP2. As long as no current flows through FP2, the potential Vsp_2 will be zero, and thus a bias voltage Vgs2 will exist. When the bias voltage Vgs2 exceeds the threshold voltage of the finger device FP2, the finger device FP2 will be fully turn on. The same mechanism will create a "domino effect" that will turn on all finger devices FP1–FPk one after the other.

Figure 10:
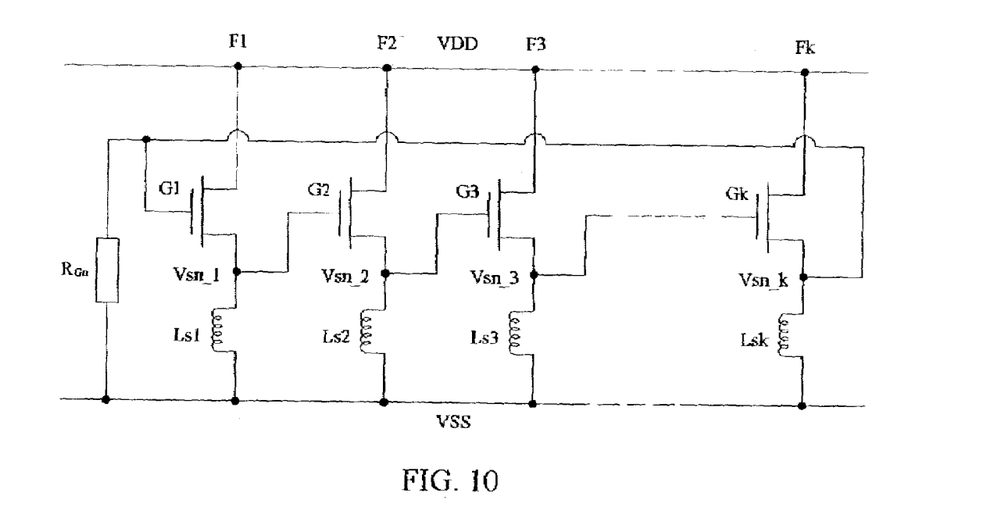
FIG. 10 is a schematic diagram showing an uniform turn-on design on multi-finger NMOS in power-rail ESD clamp with source inductors.

FIG. 10 shows an electrostatic discharge protection circuit with the uniform turn-on design on multi-finger NMOS in power-rail ESD clamp with sources inductors. The electrostatic discharge protection circuit shown in FIG. 10 is similar to that shown in FIG. 7 except the power rail VDD replace the input pad 200.

Figure 11:
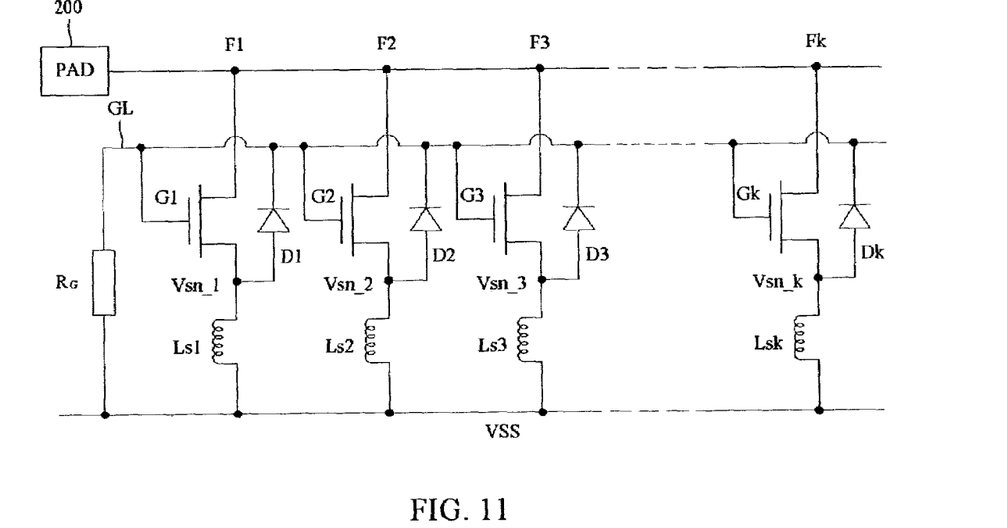
FIG. 11 is a schematic diagram showing an alternative uniform turn-on design on multi-finger NMOS in power-rail ESD clamp with source inductors.

FIG. 11 shows an electrostatic discharge protection circuit with the uniform turn-on design on multi-finger NMOS in power-rail ESD clamp with sources inductors. The electrostatic discharge protection circuit shown in FIG. 11 is similar to that shown in FIG. 7 except the power rail VSS replace the input pad 200.

The Second Embodiment

Figure 12:
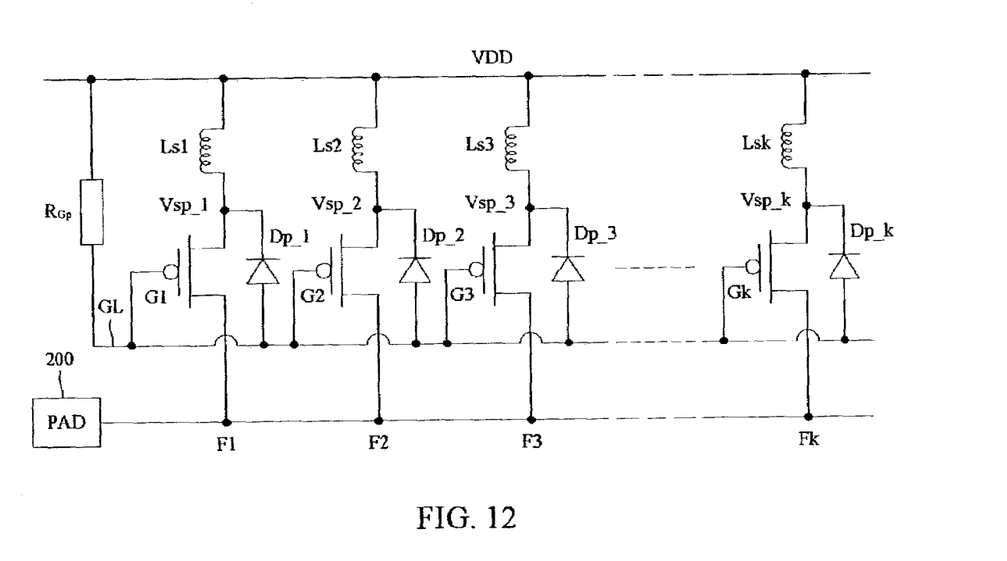
FIG. 12 is a schematic diagram showing an another uniform turn-on design on multi-finger NMOS for input pad with source inductors.

FIG. 12 shows an electrostatic discharge protection circuit with the uniform turn-on design on multi-finger NMOS for input pad with sources inductors. The electrostatic discharge protection circuit for an integrated circuit having an input pad includes NMOS transistor having finger devices F1–Fk. Finger devices F1–Fk have drains coupled to the input pad 200, sources coupled to a potential VSS through inductors Ls1–Lsk, and gates G1–Gk shorted together. Diodes D1–Dk coupled between the gates G1–Gk and the sources of the finger devices F1–Fk respectively. Diodes D1–Dk have anodes coupled to the sources of the finger devices F1–Fk and cathodes coupled to the gates G1–Gk of the finger devices F1–Fk. A resistor Rg is coupled between all the gate G1–GN of the finger devices F1–FN and the potential VSS.

The diodes D1–Dk are used to control the common gate line connected to all the gates G1–Gk of the finger devices F1–Fk. For example, if the finger device F2 is triggered initially, a voltage drop across the inductor Ls2 occurs. Thus the corresponding diode Dp_2 becomes forward biased. The other diodes are reversed biased preventing a large loss of the charge on the common gate line. As a result, the current flowing through the diode Dp_2 to common gate line charges the attached gates of all the finger devices F1–Fk. Therefore, all the finger devices F1–Fk are simultaneously turned on.

Figure 13:
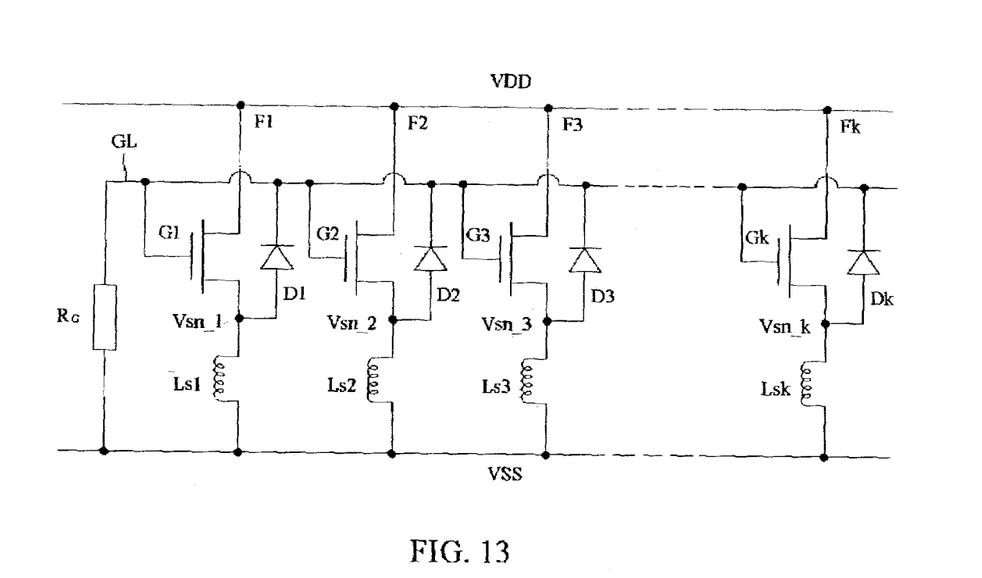
FIG. 13 is a schematic diagram showing an another uniform turn-on design on multi-finger PMOS for input pad with source inductors.

FIG. 13 shows an electrostatic discharge protection circuit with the uniform turn-on design on multi-finger PMOS for input pad with sources inductors. The electrostatic discharge protection circuit for an integrated circuit having an input pad includes PMOS transistor having finger devices F1–Fk. The finger devices F1–Fk have drains coupled to the input pad 200, sources coupled to a potential VDD through inductors Ls1–Lsk, and gates G1–Gk shorted together. Diodes D1–Dk coupled between the gates G1–Gk and the sources of the finger devices F1–Fk respectively. Diodes D1–Dk have cathodes coupled to the sources of the finger devices F1–Fk and anodes coupled to the gates G1–Gk of the finger devices F1–Fk. A resistor Rg is coupled between all the gate G1–Gk of the finger devices F1–Fk and the potential VDD.

The diodes D1–Dk are used to control the common gate line connected to all the gates G1–Gk of the finger devices F1–Fk. For example, if the finger device F2 is triggered initially, a voltage drop across the inductor Ls2 occurs. Thus the corresponding diode D2 becomes forward biased. The other diodes are reversed biased preventing a large loss of the charge on the common gate line. As a result, the current flowing through the diode D2 to common gate line discharges the attached gates of all the finger devices F1–Fk. Therefore, all the finger devices F1–Fk are simultaneously turned on.

Figure 14:
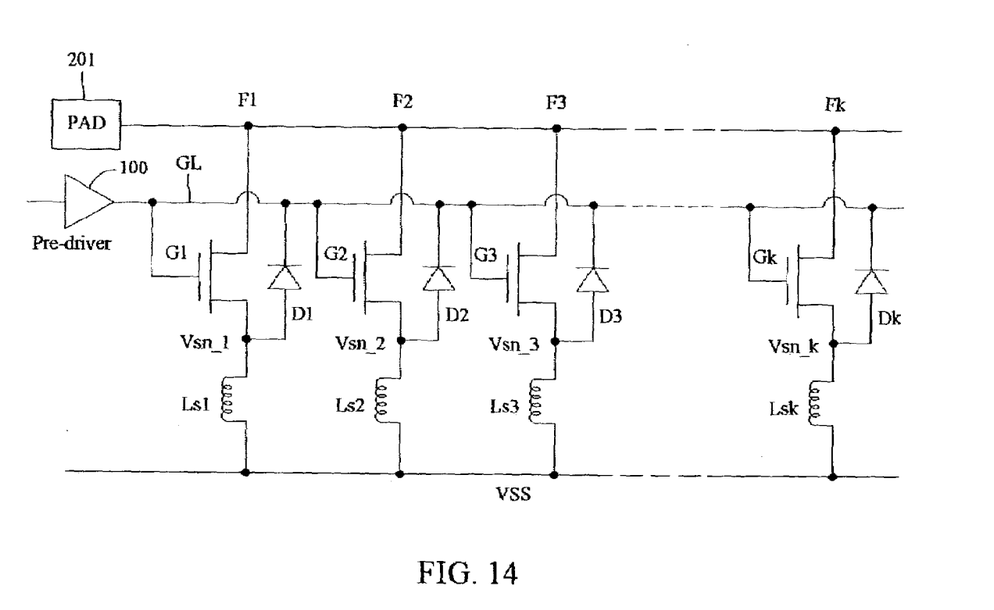
FIG. 14 is a schematic diagram showing an another uniform turn-on design on multi-finger NMOS for output pad with source inductors.

FIG. 14 shows an electrostatic discharge protection circuit with the uniform turn-on design on multi-finger NMOS for output pad with sources inductors. The electrostatic discharge protection circuit for an integrated circuit having an output pad 201 includes NMOS transistor having finger devices F1–Fk. Finger devices F1–Fk have drains coupled to the input pad 200, sources coupled to a potential VSS through inductors Ls1–Lsk, and gates G1–Gk shorted together. Diodes D1–Dk coupled between the gates G1–Gk and the sources of the finger devices F1–Fk respectively. Diodes D1–Dk have anodes coupled to the sources of the finger devices F1–Fk and cathodes coupled to the gates G1–Gk of the finger devices F1–Fk. A pre-driver 100 is coupled to all the gates of the finger devices F1–Fk.

The diodes D1–Dk are used to control the common gate line connected to all the gates G1–Gk of the finger devices F1–Fk. For example, if the finger device F2 is triggered initially, a voltage drop across the inductor Ls2 occurs. Thus the corresponding diode D2 becomes forward biased. The other diodes are reversed biased preventing a large loss of the charge on the common gate line. As a result, the current flowing through the diode D2 to common gate line charges the attached gates of all the finger devices F1–Fk. Therefore, all the finger devices F1–Fk are simultaneously turned on.

Figure 15:
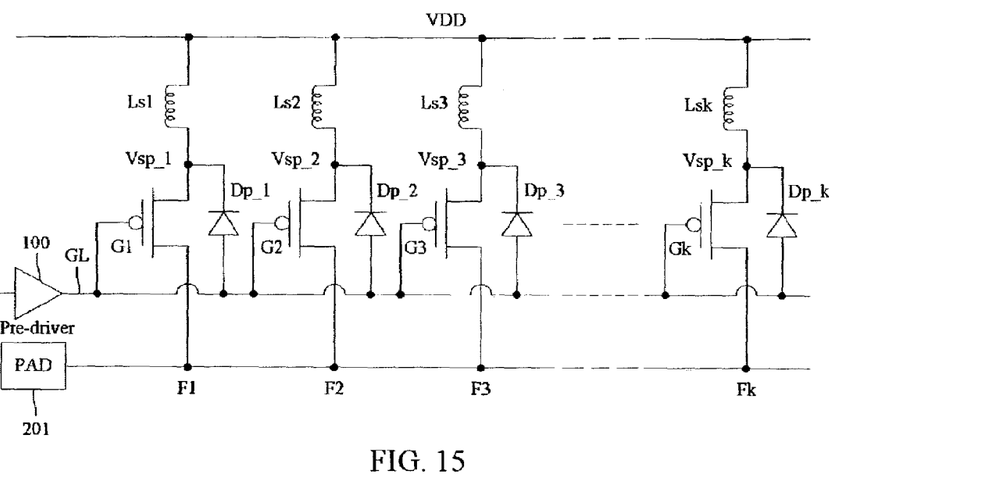
FIG. 15 is a schematic diagram showing an another uniform turn-on design on multi-finger PMOS for output pad with source inductors.

FIG. 15 shows an electrostatic discharge protection circuit with the uniform turn-on design on multi-finger PMOS for output pad with sources inductors. The electrostatic discharge protection circuit for an integrated circuit having an output pad 201 includes a PMOS transistor having finger devices F1–Fk. Finger devices F1–Fk have drains coupled to the output pad 201, sources coupled to a potential VDD through inductors Ls1–Lsk, and gates G1–Gk shorted together. Diodes D1–Dk coupled between the gates G1–Gk and the sources of the finger devices F1–Fk respectively. Diodes D1–Dk have cathodes coupled to the sources of the finger devices F1–Fk and anodes coupled to the gates G1–Gk of the finger devices F1–Fk. A pre-driver 100 is coupled to all the gates of the finger devices F1–Fk.

The diodes D1–Dk are used to control the common gate line connected to all the gates G1–Gk of the finger devices F1–Fk. For example, if the finger device F2 is triggered initially, a voltage drop across the inductor Ls2 occurs. Thus the corresponding diode D2 becomes forward biased. The other diodes are reversed biased preventing a large loss of the charge on the common gate line. As a result, the current flowing through the diode D2 to common gate line charges the attached gates of all the finger devices F1–Fk. Therefore, all the finger devices F1–Fk are simultaneously turned on.

Figure 16:
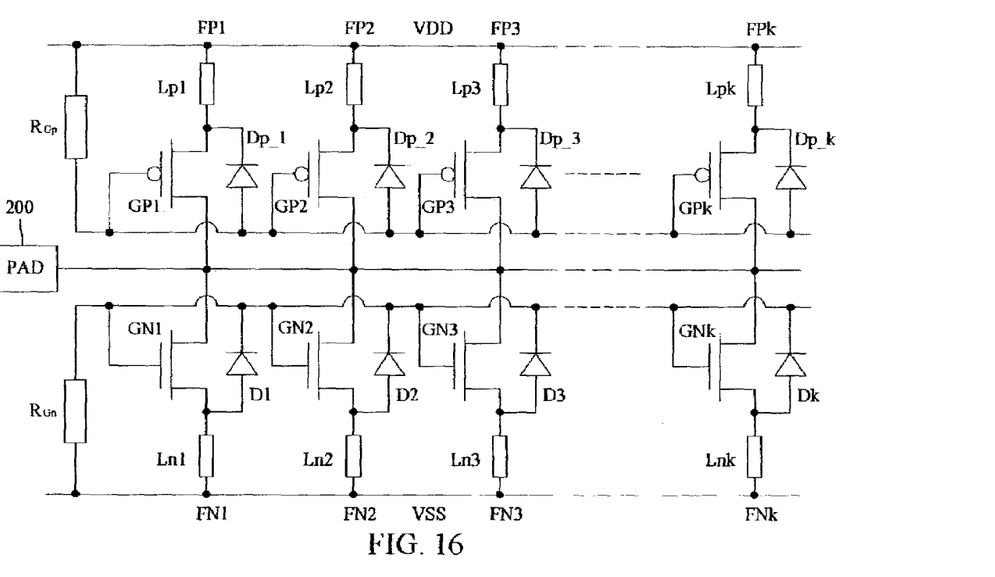
FIG. 16 is a schematic diagram showing an another uniform turn-on design on multi-finger NMOS and PMOS for input pad with source inductors.

FIG. 16 shows an electrostatic discharge protection circuit with the uniform turn-on design on multi-finger NMOS and PMOS for input pad with sources inductors. The electrostatic discharge protection circuit for an integrated circuit having an input pad 200 includes a NMOS transistor having finger devices FN1–FNk and a PMOS transistor having finger devices FP1–FPk. The finger devices FN1–FNk have drains coupled to the input pad 200, sources coupled to a potential VSS through inductors Lns1–Lnsk, and gates GN1–GNk shorted together. Diodes D1–Dk coupled between the gates GN1–GNk and the sources of the finger devices FN1–FNk respectively. Diodes D1–Dk have anodes coupled to the sources of the finger devices FN1–FNk and cathodes coupled to the gates GN1–GNk of the finger devices FN1–FNk. A resistor Rgn is coupled between all of the gates GN1–GNk of the finger device FN1–FNk and the potential VSS. The finger devices FP1–FPk have drains coupled to the input pad 200, sources coupled to a potential VDD through inductors Lp1–Lpk, and gates Gp1–GPk shorted together. Diodes Dp1–Dpk coupled between the gates Gp1–GPk and the sources of the finger devices FP1–FPk respectively. Diodes Dp1–Dpk have cathodes coupled to the sources of the finger devices FP1–FPk and anodes coupled to the gates Gp1–GPk of the finger devices FP1–FPk. A resistor Rgp is coupled between all the gate Gp1–GPk of the finger devices FP1–FPk and the potential VDD.

Figure 17:
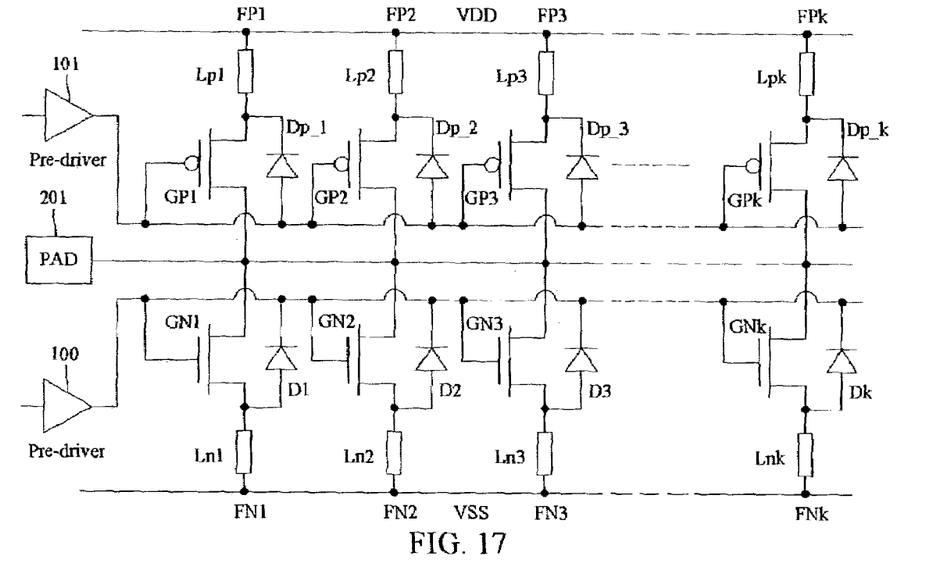
FIG. 17 is a schematic diagram showing an another uniform turn-on design on multi-finger NMOS and PMOS for output pad with source inductors.

FIG. 17 shows an electrostatic discharge protection circuit with the uniform turn-on design on multi-finger NMOS and PMOS for output pad with sources inductors. The electrostatic discharge protection circuit shown in FIG. 17 is similar to that shown in FIG. 16 except the pre-drivers 101, 100 replace the resistors RGp and RGn.

Figure 18:
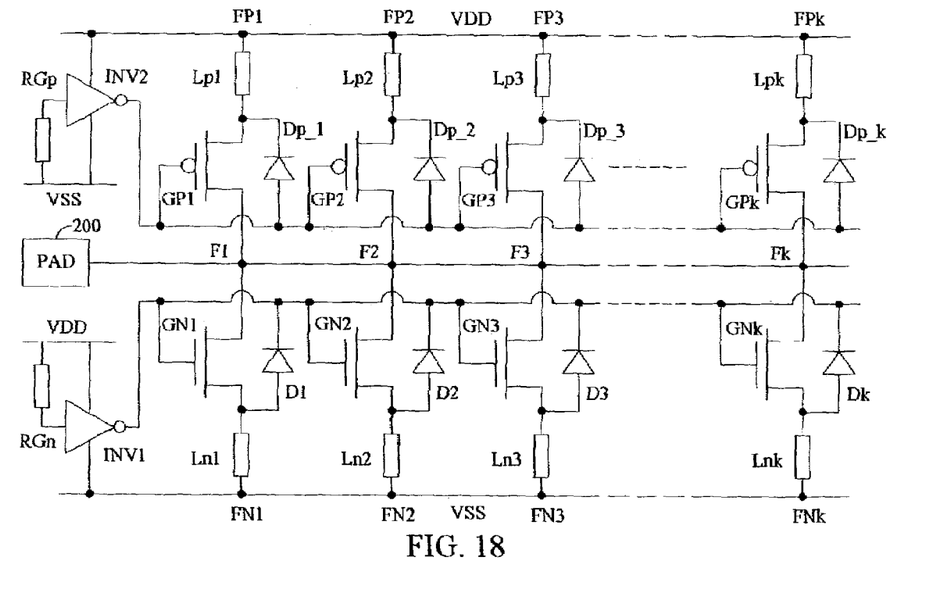
FIG. 18 is a schematic diagram showing an another uniform turn-on design on multi-finger NMOS and PMOS for input pad with source inductors.

FIG. 18 shows an electrostatic discharge protection circuit with the uniform turn-on design on multi-finger NMOS and PMOS for input pad with sources inductors. The electrostatic discharge protection circuit shown in FIG. 18 is similar to that shown in FIG. 17 except the resistors RGp and the inverter INV2 replace the pre-driver 101 and the resistors RGn and the inverter INV_1 replace the pre-driver 100.

Figure 19:
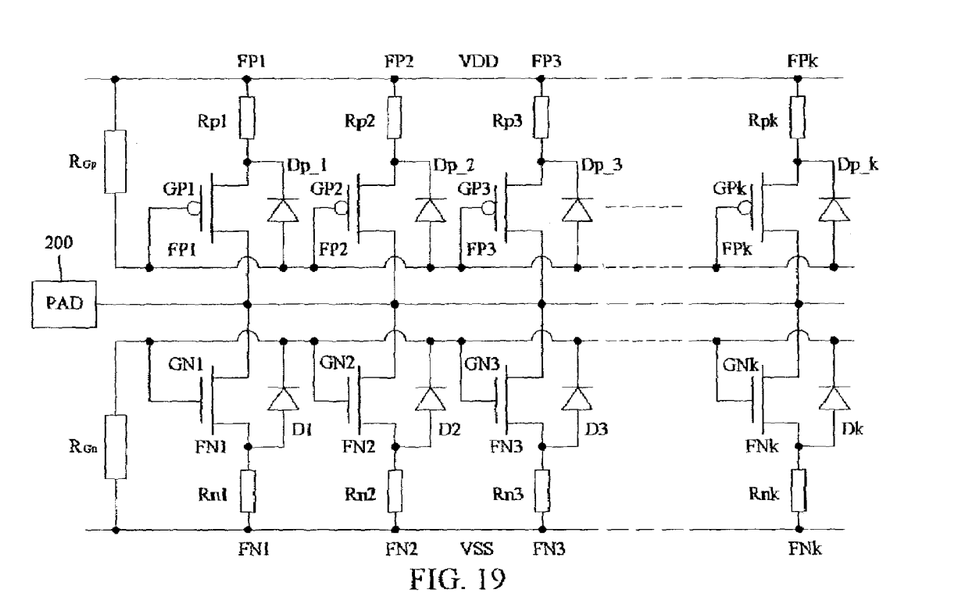
FIG. 19 is a schematic diagram showing an another uniform turn-on design on multi-finger NMOS and PMOS for input pad with source resistors.

FIG. 19 shows an electrostatic discharge protection circuit with the uniform turn-on design on multi-finger NMOS and PMOS for input pad with sources resistors. The electrostatic discharge protection circuit shown in FIG. 19 is similar to that shown in FIG. 16 except the resistors Rp1–Rpk replace the inductors Lp1–Lpk and the resistors Rn1–Rnk replace the inductors Ln1–Lnk.

Figure 20:
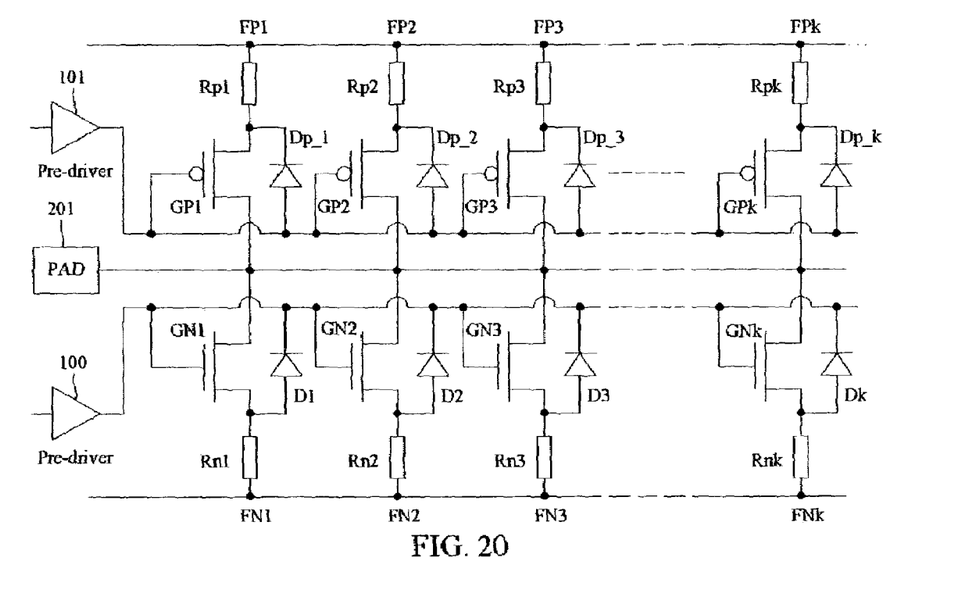
FIG. 20 is a schematic diagram showing an another uniform turn-on design on multi-finger NMOS and PMOS for output pad with source resistors.

FIG. 20 shows an electrostatic discharge protection circuit with the uniform turn-on design on multi-finger NMOS and PMOS for output pad with sources resistors. The electrostatic discharge protection circuit shown in FIG. 20 is similar to that shown in FIG. 17 except the resistors Rp1–Rpk replace the inductors Lp1–Lpk and the resistors Rn1–Rnk replace the inductors Ln1–Lnk.

Figure 21:
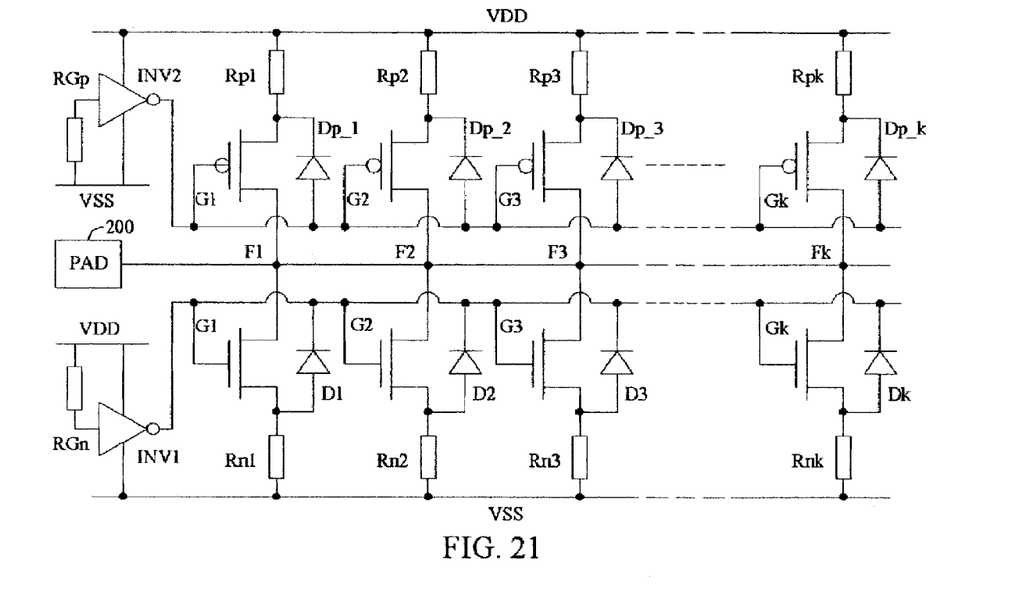
FIG. 21 is a schematic diagram showing an another uniform turn-on design on multi-finger NMOS and PMOS for input pad with source resistors.

FIG. 21 shows an electrostatic discharge protection circuit with the uniform turn-on design on multi-finger NMOS and PMOS for input pad with sources resistors. The electrostatic discharge protection circuit shown in FIG. 20 is similar to that shown in FIG. 19 except the resistors RGp and the inverter INV2 replace the pre-driver 101 and the resistors RGn and the inverter INV_1 replace the pre-driver 100.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. An electrostatic discharge protection circuit for an integrated circuit having an input/output pad comprising:
   a first type MOS transistor having plural finger devices cascaded wherein each finger device has a source coupled to a gate of the next finger device and a drain coupled to the input/output pad, a last finger device has a source coupled to a gate of a first finger device; and
   a plurality of inductors each coupled between one of the finger devices and a first potential;
   wherein a voltage drop is induced across the inductor during an ESD event.

2. The electrostatic discharge protection circuit as claimed in claim 1 wherein the first type MOS transistor is NMOS transistor.

3. The electrostatic discharge protection circuit as claimed in claim 1 wherein the first type MOS transistor is a PMOS transistor.

4. The electrostatic discharge protection circuit as claimed in claim 1 further comprising:
   a resistor coupled between the gate of the first finger device and the first potential.

5. The electrostatic discharge protection circuit as claimed in claim 1 further comprising:
   a second type MOS transistor having plural finger devices cascaded wherein each finger device has a source coupled to a gate of the next finger device and coupled to a second potential through an inductor and a drain coupled to the input pad, the last finger device has a source coupled to a gate of the first finger device.

6. The electrostatic discharge protection circuit as claimed in claim 5 wherein the first type MOS transistor is a NMOS transistor and the second type MOS transistor is a PMOS transistor.

7. The electrostatic discharge protection circuit as claimed in claim 5 further comprising:
   a first resistor coupled between the gate of the first finger device of the first type MOS transistor and the first potential; and
   a second resistor coupled between the gate of the first finger device of the second type MOS transistor and the second potential.

8. An electrostatic discharge protection circuit for an integrated circuit having an input/output pad comprising:
   a first type MOS transistor having plural finger devices; and
   a plurality of inductors each coupled between one of the finger devices and a first potential;
   wherein some of the plural finger devices have drains coupled to the input/output pad, gates shorted together and plural diodes coupled between the gates and sources of the plural finger devices, and a voltage drop is induced across each inductor during an ESD event.

9. The electrostatic discharge protection circuit as claimed in claim 8 wherein the first type MOS transistor is a NMOS transistor.

10. The electrostatic discharge protection circuit as claimed in claim 9 wherein the plural diodes have anodes coupled to the sources of the plural finger devices and cathodes coupled to the gates of the plural finger devices.

11. The electrostatic discharge protection circuit as claimed in claim 8 wherein the first type MOS transistor is a PMOS transistor.

12. The electrostatic discharge protection circuit as claimed in claim 11 wherein the plural diodes have cathodes coupled to the sources of the plural finger devices and anodes coupled to the gates of the plural finger devices.

13. The electrostatic discharge protection circuit as claimed in claim 8 further comprising:
   a resistor coupled between the gates of the plural finger devices and the first potential.

14. The electrostatic discharge protection circuit as claimed in claim 8 further comprising:
   a pre-driver coupled to the gates of the plural finger devices.

15. The electrostatic discharge protection circuit as claimed in claim 8 further comprising:
   a second type MOS transistor having plural finger devices;
   wherein some of the plural finger devices have drains coupled to the input/output pad, sources coupled to a second potential through plural loads, gates shorted together and plural diodes having anodes coupled to sources of the plural finger devices and cathodes coupled to the gates of the plural finger devices.

16. The electrostatic discharge protection circuit as claimed in claim 15 wherein the first type MOS transistor is a NMOS transistor and the second type MOS transistor is a PMOS transistor.

17. The electrostatic discharge protection circuit as claimed in claim 15 wherein to plural loads are plural inductors.

18. The electrostatic discharge protection circuit as claimed in claim 17 further comprising:
   a first resistor coupled between the gates of the plural finger devices of the first type MOS transistor and the first potential; and
   a second resistor coupled between the gates of the plural finger devices of the second type MOS transistor and the second potential.

19. The electrostatic discharge protection circuit as claimed in claim 17 further comprising:
   a first pre-driver coupled to the gates of the plural finger devices of the first type MOS transistor; and
   a second pre-driver coupled to the gates of the plural finger devices of the second type MOS transistor.

20. The electrostatic discharge protection circuit as claimed in claim 17 further comprising:
   a first inverter having an input end and an output end wherein the output end is coupled to the gates of the plural finger devices of the first type MOS transistor;
   a first resistor coupled between the input end of the first inverter and the first potential;
   a second inverter having an input end and an output end wherein the output end coupled to the gates of the plural finger devices of the second type MOS transistor; and
   a second resistor coupled between the input end of the second inverter and the second potential.

21. The electrostatic discharge protection circuit as claimed in claim 15 wherein the plural loads are plural resistors.

22. The electrostatic discharge protection circuit as claimed in claim 21 further comprising:
   a first resistor coupled between the gates of the plural finger devices of the first type MOS transistor and the first potential; and
   a second resistor coupled between the gates of the plural finger devices of the second type MOS transistor and the second potential.

23. The electrostatic discharge protection circuit as claimed in claim 21 further comprising:
   a first pre-driver coupled to the gates of the plural finger devices of the first type MOS transistor; and
   a second pre-driver coupled to the gates of the plural finger devices of the second type MOS transistor.

24. The electrostatic discharge protection circuit as claimed in claim 21 further comprising:
   a first inverter having an input end and an output end wherein the output end is coupled to the gates of the plural finger devices of the first type MOS transistor;
   a first resistor coupled between the input end of the first inverter and the first potential;
   a second inverter having an input end and an output end wherein the output end coupled to the gates of the plural finger devices of the second type MOS transistor, and
   a second resistor coupled between the input end of the second inverter and the second potential.

* * * * *